United States Patent [19]

Pacifici et al.

[11] 4,040,923

[45] Aug. 9, 1977

[54] PHOTOPOLYMERIZABLE POLYMERIC COMPOSITIONS CONTAINING HALOGEN CONTAINING AROMATIC KETONES

[75] Inventors: James G. Pacifici; Gordon C. Newland, both of Kingsport; Hobert M. Beard, Jr., Johnson City, all of Tenn.

[73] Assignee: Eastman Kodak Company, Rochester, N.Y.

[21] Appl. No.: 692,403

[22] Filed: June 3, 1976

[51] Int. Cl.² .......................... C08F 8/00; C08F 2/46
[52] U.S. Cl. ..................... 204/159.15; 96/115 P; 204/159.14; 204/159.18; 204/159.19; 204/159.23; 427/54
[58] Field of Search ................ 204/159.15, 159.23, 204/159.18; 96/115 P; 427/54

[56] References Cited

U.S. PATENT DOCUMENTS

| | | | |
|---|---|---|---|
| 3,686,084 | 8/1972 | Rosenkranz et al. | 204/159.15 |
| 3,728.377 | 4/1973 | Kelly et al. | 260/473 R |
| 3,926,640 | 12/1975 | Rosen | 96/115 P |
| 3,988,228 | 10/1976 | Newland et al. | 204/159.23 |

*Primary Examiner*—Richard B. Turer
*Attorney, Agent, or Firm*—Elliott Stern; Daniel B. Reece, III

[57] ABSTRACT

The invention relates to photopolymerizable polymeric compositions useful as coating and moldable compositions which are hardenable by ultraviolet radiation. These coating and moldable compositions comprise mixtures of photopolymerizable or photocrosslinkable unsaturated compounds and at least one photoinitiator selected from the group consisting of haloalkyl carboalkoxy substituted aromatic ketones.

30 Claims, No Drawings

PHOTOPOLYMERIZABLE POLYMERIC COMPOSITIONS CONTAINING HALOGEN CONTAINING AROMATIC KETONES

This invention relates to photopolymerizable polymeric compositions useful as coating and moldable compositions. More particularly, the invention relates to photopolymerizable compositions comprising photopolymerizable or photocrosslinkable unsaturated compounds and aromatic ketone photoinitiators which compositions harden on exposure to ultraviolet radiation.

Heretofore it has been known to prepare coating compositions consisting of photopolymerizable ethylenically unsaturated materials. It is also known that the degree of polymerization and extent of crosslinking of these systems are dependent upon the intensity of the light. Under direct radiation, this conversion proceeds very slowly, principally because the polymerizable compounds absorb only short wavelength light. Attempts have been made, therefore, to find substances which may be added to the polymerizable or crosslinkable compounds that are capable of accelerating the polymerization.

There are many substances commonly defined as a photoinitiator, which have been found which are capable of accelerating photopolymerization. In general, these additives function by absorption of light and spontaneous fragmentation into radicals. The radicals subsequently produced react with the unsaturated components and initiate the polymerization or crosslinking process. The effectiveness of a compound as a photoinitiator is not limited to the rate at which it accelerates the curing process. Its usefulness is also dependent upon such properties as volatility, solubility in polymerizable compositions, color stability during photoreactions, and its effect on storage stability of the formulated compositions. Such accelerators include, for example, halogenated aliphatic, alicyclic, and aromatic hydrocarbons and their mixtures in which the halogen atoms are attached directly to the ring structure in the aromatic and alicyclic compounds; that is, the halogen is bonded directly to the aromatic hydrocarbon nucleus; the halogen atoms are attached to the carbon chain in the aliphatic compounds. The halogen may be chlorine, bromine, or iodine. These sensitizers or photoinitiators are used in amounts of about 0.1 to 25% by weight and preferably from 0.5 to 5% of the compound-photoinitiator mixture. Suitable photoinitiators previously used in the art include, for example, polychlorinated polyphenyl resins, such as polychlorinated diphenyls, polychlorinated triphenyls, and mixtures of polychlorinated diphenyls and polychlorinated triphenyls; chlorinated rubbers, such as the Parlons (Hercules Power Company); copolymers of vinyl chloride and vinyl isobutyl ether, such as Vinoflex MP-400 (BASF Colors and Chemicals, Inc.); chlorinated aliphatic waxes, such as Chlorowax 70 (Diamond Alkali, Inc.); Perchloropentacyclodecane, such as Dechlorane (Hooker Chemical Co.); chlorinated paraffins, such as Clorafin 40 (Hooker Chemical Co.) and Unichlor-70B (Neville Chemical Co.); mono- and polychlorobenzenes; mono- and polybromobenzenes; mono- and polychloroxylenes; mono- and polybromoxylenes; dichloromaleic anhydride; 1-chloro-2-methyl naphthalene; 2,4-dimethylbenzene sulfonyl chloride; 1-bromo-3-(m-phenoxy benzene); 2-bromoethyl methyl ether; chlorendic anhydride; and the like; and mixtures thereof, and the like. While there are many photoinitiators known in the art to increase the speed of curability or hardenability of coating and moldable compositions, there is a need in the art for more efficient and effective photoinitiators. Therefore, to provide more effective and efficient photoinitiators would be an advance in the state of the art.

It is, therefore, an object of the present invention to provide more effective and efficient ultraviolet photoinitiators.

Another object of the present invention is to provide useful coating and moldable compositions characterized by improved hardenability to ultraviolet radiation.

It is still another object of the present invention to provide compositions containing photoinitiators which provide ultraviolet curable and hardenable coatings and moldable articles such as films.

It is a still further object of this invention to provide compositions comprising ethylenically unsaturated polymerizable compositions and at least one photoinitiator capable of curing when exposed to actinic radiation and especially ultraviolet radiation.

It is a still further object of this invention to provide compositions containing photoinitiators capable of curing and hardening when exposed to actinic radiations, including short wave-length visible radiations.

Further objects and advantages of the invention will be apparent to those skilled in the art from the accompanying disclosure and claims.

In accordance with the present invention, polymeric compositions are provided composed of ethylenically unsaturated compounds and a photoinitiator having the following formula:

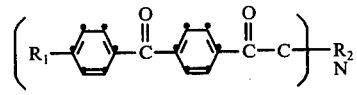

$R_1$ is equal to $CH_2X$, $CHX_2$ $Cx_3$ and can be the same or different.
X Cl, Br.
N is an integer and is equivalent to the valence of $R_2$.
$R_2$ is monovalent lower alkyl, or a polyvalent alkylene group of the formula $C_xH_{2X-Y}$ in which X is 2 to 10 and Y is 0-2.

These compounds can be prepared readily by simple acylation under Friedel-Crafts conditions followed by transesterification and halogenation under free radical conditions as follows:

1.

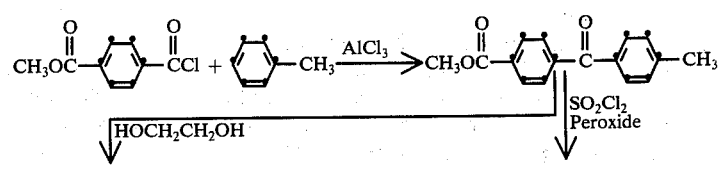

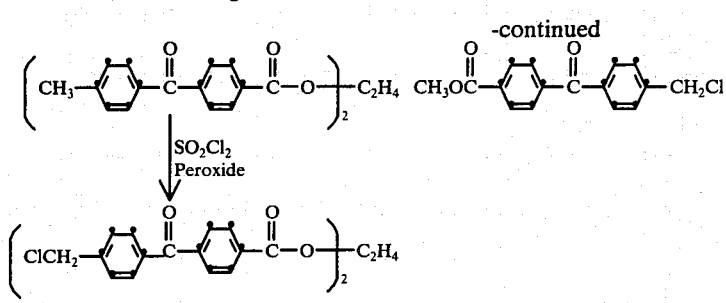

The ethylenically unsaturated compounds useful in the present invention can be for example lower alkyl and substituted alkyl esters of acrylic and methacrylic acid. Examples of such esters include: methyl methacrylate, ethyl methacrylate, 2-ethylhexyl methacrylate, isobutyl methacrylate, butyl acrylate, 2-ethylhexyl acrylate, 2-hydroxyethyl acrylate, 2-methoxyethyl acrylate, 2-hydroxypropyl acrylate, and the like. Also useful are polyacrylyl compounds represented by the general formula:

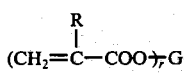

R is hydrogen or methyl; G is a polyvalent alkylene group of the formula

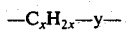

in which X is 2 to 10 and y is 0 to 2 (e.g. (a) divalent alkylene such as $C_xH_{2x}$ when y = 0, i.e. $-C_2H_4-$, $-C_3H_6-$, $-C_5H_{10}-$, neo-$C_5H_{10}$ and the like; (b) trivalent alkylene such as $C_xH_{2x}-1$ when y = 1, i.e.

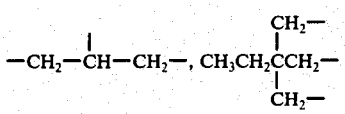

and the like; or (c) tetravalent alkylene such as $C_xH_{2x-2}$ when y = 2,

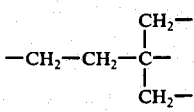

and the like); a divalent $-(C_tH_{2t}O)_tC_tH_{2t}-$ group in which t is 1 to 10 (e.g., oxyethylene, oxypropylene, oxybutylene, polyoxyethylene, polyoxypropylene, polyoxybutylene, polyoxyethylene-oxypropylene, $-CH_2C(CH_3)_2COOCH_2C(CH_3)_2CH_2-$ etc.); and r is the valence of G and can be from 2 to 4. Also useful are allyl acrylates and methacrylates; e.g., allyl methacrylate, allyl acrylate, diallyl acrylate. Other unsaturated compounds useful in the invention are, vinyl acetate, vinyl and vinylidine halides; e.g., vinyl chloride, vinylidine chloride, amides; e.g., acrylamide, diacetone acrylamide, vinyl aromatics; e.g., styrene, alkyl styrenes, halostyrenes, and divinyl benzenes.

In addition, other unsaturated compounds which can be photopolymerized by using the initiators of this invention are unsaturated polyester resins which are known in the art. Such polyesters, which may be prepared by reaction of α,β-unsaturated dicarboxylic acids, can be replaced by saturated dicarboxylic acids or aromatic dicarboxylic acids, e.g., isophthalic acid and the like. Polyhydric alcohols are preferably dihydric alcohols such as ethylene glycol, however, trihydric and polyhydric alcohols such as trimethylolpropane can also be conjointly used. Examples of such α,β-unsaturated dicarboxylic acids or their anhydride counterparts include maleic, fumaric, itaconic and citraconic and the like. Also, unsaturated compounds such as acrylate-capped or acrylate-terminated oligomers, as, for example, acrylate-capped urethanes and epoxy resins and the like are useful, as well as cellulose esters containing an α,β-unsaturated carboxylate moiety.

The above unsaturated compounds can be used alone or as mixtures of such compounds or mixtures in combination with other unsaturated components and the like.

The photoinitiators may be added at any time in the production of the photopolymerizable compositions in amounts conventionally used for photoinitiators. They are generally used in amounts of from 0.01 to 10%, preferably in amounts of from 0.5 to 3% by weight, based on the weight of the light-sensitive composition.

Conventional thermal inhibitors which are used in the production of light-sensitive compositions, for example hydroquinone, p-methoxy phenol, t-butyl hydroquinone may also be used in the conventional manner in the light-sensitive compositions of this invention to alter the curing rates and/or to provide longer storage stability.

The photopolymerizable compositions of the present invention may also contain other additives, pigments, colorants, stabilizers and the like. For example, polymeric compositions, such as unsaturated polyesters may also contain and generally do contain other additives such as white or colored pigments or colorants, antioxidants, plasticizers, flow aids, processing aids, polymeric modifiers and the like.

This invention will be further illustrated by the following examples although it will be understood that these examples are included merely for purposes of illustration and are not intended to limit the scope of the invention.

EXAMPLE 1

4-Methyl-4'-carbomethoxybenzophenone is prepared according to the following procedure:

To 80 grams (0.6 mole) of $AlCl_3$ in 250 ml. of toluene at 100° C. was added 4-carbomethoxybenzoyl chloride (99 grams, 0.5 mole) in 50 ml. of toluene. The mixture was heated for 3 hours at 100° C., cooled to room temperature and added to 300 ml. of a mixture of 50/50 ice/concentrated HCl. The layers were separated and the toluene layer washed with water. The toluene was stripped at 80° C. in vacuo until a stirrable slurry remained. To the resulting stirrable slurry was added 100 ml. of isopropanol and the product isolated by filtration. The product, a white solid, melted at 125°–126° C.

Other 4-methyl-4'-carboalkoxybenzophenones can be prepared by this same procedure using other 4-carboalkoxybenzoyl chlorides, as, for example, 4-carboethoxybenzoyl chloride or 4-carbopropyloxybenzoyl chloride and the like.

EXAMPLE 2

4-Chloromethyl-4'-carbomethoxybenzophenone is prepared according to the following procedure:

To a mixture of 4-methyl-4'-carbomethoxybenzophenone (0.1 mole), benzoyl peroxide (0.1 gram) and 100 ml. of chlorobenzene at 50° C. was added sulfuryl chloride (17 grams, 0.11 mole). The mixture was heated at 80° C. for 2 hours, followed by stripping of solvent to give a slurry. To this slurry was added isopropyl alcohol and the product collected by filtration. The product, recrystallized from toluene, had a melting point of 122°–125° C.

The 4-dichloromethyl-4'-carbomethoxybenzophenone and 4-trichloromethyl-4'-carbomethoxybenzophenone can be prepared by similar procedures using an excess of sulfuryl chloride as the chlorinating agent.

EXAMPLE 3

4-Bromomethyl-4'-carbomethoxybenzophenone is prepared according to the following procedure:

To a mixture of 4-methyl-4'-carbomethoxybenzophenone (0.1 mole), benzoyl peroxide (0.1 gram) and 100 ml. of chlorobenzene at 50° C. was added n-bromosuccinimide (0.1 mole). The mixture was heated at 80° C. for 2 hours, filtered to remove the succinimide and the excess solvent stripped. To the resultant slurry was added isopropyl alcohol and the product collected by filtration. The crystalline product was recrystallized from toluene to give a yield of 80%.

EXAMPLE 4

Preparation of Hydroquinone bis(p-chlorotoluoyl)-benzoate.

To 4-carbomethoxy-4'-chloromethylbenzophenone (0.1 mole) in 250 ml. of chlorobenzene were added a stoichiometric amount of hydroquinone and 0.5 g. zinc acetate. The mixture was heated at 100° C. until methanol ceased to be evolved after which the chlorobenzene was stripped to leave a stirrable slurry. The slurry was flooded with isopropanol and filtered to recover the product by filtration. By this procedure other esters can be prepared using the appropriate glycol. Glycols useful in these preparations are cyclohexanedimethanol, diethylene glycol, neopentyl glycol. Tetra esters may also be produced using pentaerythritol.

EXAMPLE 5

Preparation of ethylene glycol bis(p-chlorotoluoyl)-benzoate: 4-Carbomethoxy-4'-chloromethylbenzophenone (0.1 mole) was dissolved in 100 ml. of ethylene glycol, 0.5 g. of zinc acetate was added and the mixture heated at 100° C. while methanol was distilled off. The temperature was gradually raised to 170° C. and heating continued until methanol ceased to be evolved. The reaction mixture was cooled, flooded (with water and the white solid collected by filtration.

The corresponding bromine containing compound can be prepared using 4-carbomethoxy-4'-bromomethylbenzophenone in place of 4-carbomethoxy-4'-carbomethylbenzophenone. Also, corresponding compounds having both bromine and chlorine can be prepared using a 1:1 mole ratio of 4-carbomethoxy-4'-chloromethylbenzophenone and 4-carbomethoxy-4'-bromomethylbenzophenone.

EXAMPLE 6

An unsaturated photopolymerizable polymeric composition is prepared as follows:

The compounds to be evaluated were admixed at 2% (w/w) with a solution of maleic anhydride-propylene glycol polyester in styrene. Films were coated from the compositions and cured with a Gates 42OU11B lamp (80 watt/inch) for one minute. Evaluation of the degree of cure was made by extraction with dichloromethane. The results, summarized in Table 1, indicate that 4-chloromethyl-4'-carbomethoxybenzophenone is more effective than 7:1 benzophenone:Michler's ketone, a recognized commercial photoinitiator.

Table 1

| Photoinitiator | % Extractable, Cured 1 Min. |
|---|---|
| None | 72.3 |
| 7:1 Benzophenone:Michler's Ketone* | 46.2 |
| 4-Chloromethyl-4'-carbomethoxybenzophenone | 22.3 |
| α-Chloroacetophenone | 76.4 |

*Michler's Ketone is p,p'-dimethylaminobenzophenone

To a U.V.-curable composition consisting of 10 parts cellulose propionate crotonate, 89 parts 2-hydroxyethyl acrylate and one part trimethylolpropane triacrylate were added the photoinitiators at 2% (w/w). Coatings of the mixture were exposed for one minute to an 80 watt/inch mercury lamp. The cured films were then extracted with dichloromethane for 2 hours and the percent extractable determined. The results, summarized in Table 2, indicate that 4-chloromethyl-4'-carbomethoxybenzophenone is an effective photoinitiator for this system. Unlike known photoinitiators, the subject compound is effective both in air and in an inert atmosphere.

Table 2

| Photoinitiator | % Extractable Air | Inert |
|---|---|---|
| None | 100 | 100 |
| Benzophenone | 100 | 10.4 |
| α-Chloroacetophenone | 100 | 4.9 |
| 7:1 Benzophenone:Michler's Ketone | 45.7 | 5.2 |
| 4-Chloromethyl-4'-carbomethoxybenzophenone | 5.1 | 4.5 |
| Benzoin isobutyl ether | 7.4 | 5.5 |

These photopolymerizable compositions find particular utility as ultraviolet curable films and coatings. Such compositions include unsaturated polymeric compositions and a photoinitiator. Such unsaturated polymeric compositions are, for example, unsaturated polyester and polyurethane compositions, which can also contain minor amounts of poly-α-olefins, polyamides, acrylics, cellulose esters, rubbers both synthetic and natural and the like. Such compositions can be molded or shaped into articles or applied as coatings.

The invention has been described in detail with particular reference to preferred embodiments thereof, but it will be understood that variations and modifications can be effected within the spirit and scope of the invention.

We claim:

1. A composition capable of forming coatings hardenable by ultraviolet radiation comprising a mixture of a photopolymerizable or photocrosslinkable ethylenically unsaturated compound and from 0.01 to 10% by weight of a photoinitiator selected from the group consisting of aryl ketone compounds having the formula

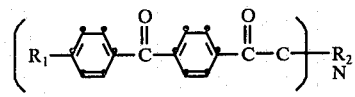

wherein $R_1$ is $-CH_2X$, $-CHX_2$, and $-CX_3$, where X is chlorine or bromine, N is an integer and is equivalent to the valence of $R_2$, and $R_2$ is monovalent lower alkyl containing 1 to 10 carbon atoms, a polyvalent alkylene group of the formula $C_xH_{2x-y}$ in which $x$ is 2 to 10 and $y$ is 0 to 2, a cycloalkylene group or aryl group containing 6 carbon atoms.

2. A composition according to claim 1 wherein said photoinitiator has the formula:

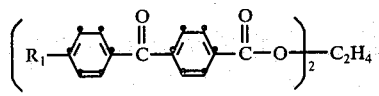

wherein $R_1$ is $-CH_2X$, $-CHX_2$, $-CX_3$ where X is chlorine or bromine.

3. A composition according to claim 2 wherein said photoinitiator has the formula

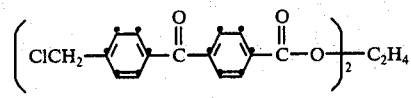

4. A composition according to claim 2 wherein said photoinitiator has the formula

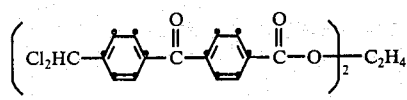

5. A composition according to claim 2 wherein said photoinitiator has the formula

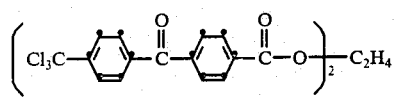

6. A composition according to claim 1 wherein said photoinitiator has the formula

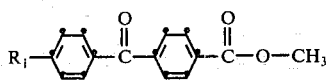

wherein $R_1$ is $-CH_2X$, $-CHX_2$, $-CX_3$ where X is chlorine or bromine.

7. A composition according to claim 6 wherein said photoinitiator has the formula

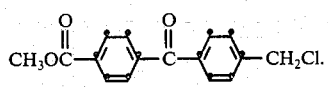

8. A composition according to claim 6 wherein said photoinitiator has the formula:

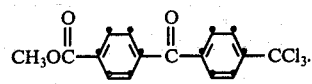

9. A composition according to claim 6 wherein said photoinitiator has the formula:

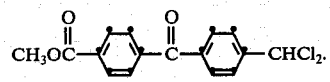

10. A composition according to claim 1 wherein said photoinitiator has the formula:

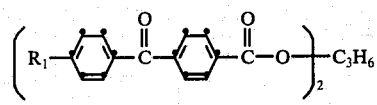

wherein $R_1$ is $-CH_2X$, $-CHX_2$, $-CX_3$ where X is chlorine or bromine.

11. A composition according to claim 10 wherein said photoinitiator has the formula

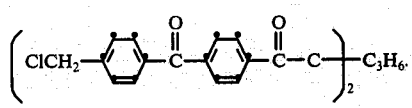

12. A composition according to claim 10 wherein said photoinitiator has the formula

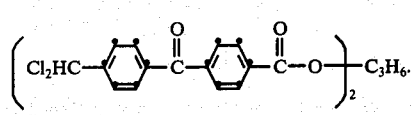

13. A composition according to claim 10 wherein said photoinitiator has the formula

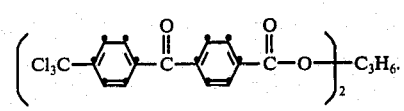

14. A composition according to claim 10 wherein said photoinitiator has the formula:

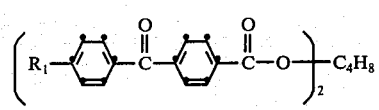

wherein $R_1$ is $-CH_2X$, $-CHX_2$, $-CX_3$ where X is chlorine or bromine.

15. A composition according to claim 14 wherein said photoinitiator has the formula

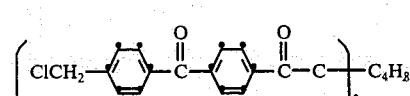

16. A composition according to claim 14 wherein said photoinitiator has the formula

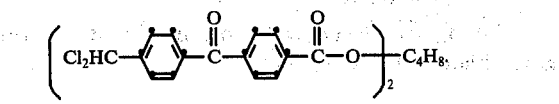

17. A composition according to claim 14 wherein said photoinitiator has the formula

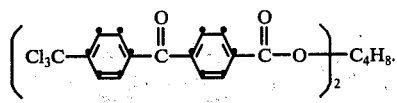

18. A composition according to claim 1 wherein said photoinitiator has the formula

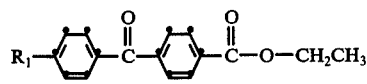

wherein $R_1$ is —$CH_2X$, —$CHX_2$, —$CX_3$ where X is chlorine or bromine.

19. A composition according to claim 6 wherein said photoinitiator has the formula

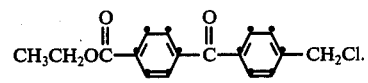

20. A composition according to claim 6 wherein said photoinitiator has the formula:

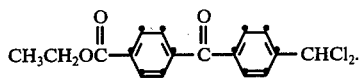

21. A composition according to claim 6 wherein said photoinitiator has the formula:

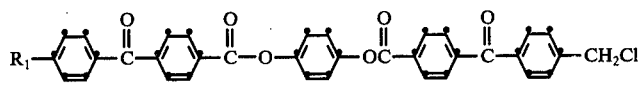

22. A composition according to claim 1 wherein said photoinitiator has the formula:

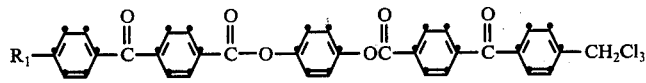

wherein $R_1$ is —$CH_2X$, —$CHX_2$, —$CX_3$ where X is chlorine or bromine.

23. A composition according to claim 1 wherein said photoinitiator has the formula:

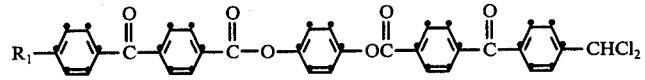

wherein $R_1$ is —$CH_2X$, —$CHX_2$, —$CH_3$ where X is chlorine or bromine.

24. A composition according to claim 1 wherein said photoinitiator has the formula:

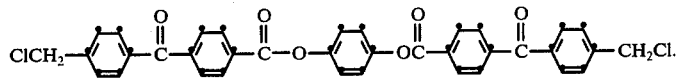

wherein $R_1$ is —$CH_2X$, —$CHX_2$, —$CX_3$ where X is chlorine or bromine.

25. A composition according to claim 22 wherein said photoinitiator has the formula:

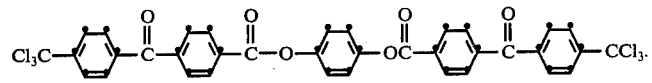

26. A composition according to claim 23 wherein said photoinitiator has the formula:

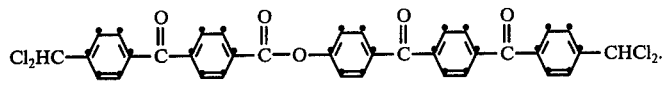

27. A composition according to claim 24 wherein said photoinitiator has the formula:

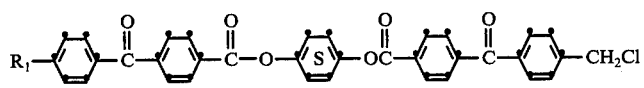

28. A composition according to claim 6 wherein said photoinitiator has the formula:

wherein $R_1$ is —$CH_2X$, —$CHX_2$, —$CX_3$ where X is chlorine or bromine.
29. A composition according to claim 1 wherein said photoinitiator has the formula:
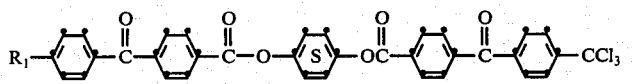
30. A composition according to claim 1 wherein said photoinitiator has the formula:
wherein $R_1$ is —$CH_2X$, —$CHX_2$, —$CX_3$ where X is chlorine or bromine.
* * * * *

UNITED STATES PATENT OFFICE
CERTIFICATE OF CORRECTION

Patent No. 4,040,923         Dated August 9, 1977

Inventor(s)  James G. Pacifici et al.

It is certified that error appears in the above-identified patent and that said Letters Patent are hereby corrected as shown below:

Claim 27, delete the formula and insert therefor

Claim 28, delete the formula and insert therefor

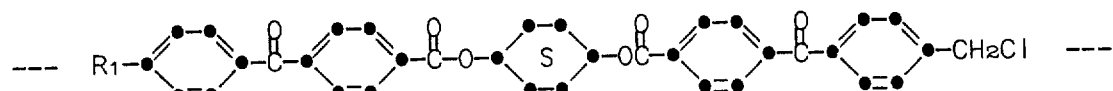

Claim 29, delete the formula and insert therefor

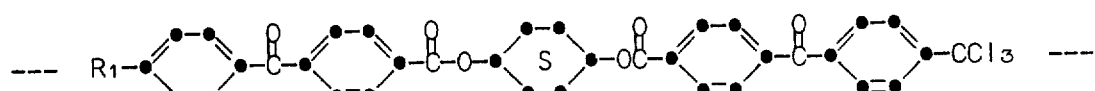

Claim 30, delete the formula and insert therefor

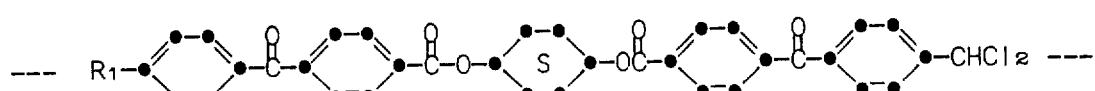

Signed and Sealed this

First Day of November 1977

[SEAL]

Attest:

RUTH C. MASON
Attesting Officer

LUTRELLE F. PARKER
Acting Commissioner of Patents and Trademarks